US009673757B2

(12) United States Patent
Liu et al.

(10) Patent No.: US 9,673,757 B2
(45) Date of Patent: Jun. 6, 2017

(54) MODIFIED TUNNELING FIELD EFFECT TRANSISTORS AND FABRICATION METHODS

(71) Applicant: GLOBALFOUNDRIES Inc., Grand Cayman (KY)

(72) Inventors: Yanxiang Liu, Glenville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 178 days.

(21) Appl. No.: 14/156,565

(22) Filed: Jan. 16, 2014

(65) Prior Publication Data

US 2015/0200298 A1    Jul. 16, 2015

(51) Int. Cl.
| | |
|---|---|
| *H01L 29/739* | (2006.01) |
| *H03C 3/02* | (2006.01) |
| *H01L 29/66* | (2006.01) |
| *H01L 29/78* | (2006.01) |
| *H03C 3/24* | (2006.01) |

(Continued)

(52) U.S. Cl.
CPC ......... *H03C 3/02* (2013.01); *H01L 29/66356* (2013.01); *H01L 29/66977* (2013.01); *H01L 29/7391* (2013.01); *H01L 29/7848* (2013.01); *H03C 3/245* (2013.01); *H01L 29/0847* (2013.01); *H01L 29/161* (2013.01)

(58) Field of Classification Search
CPC ........... H01L 29/7848; H01L 29/66977; H01L 21/324; H01L 29/0847; H01L 21/26513; H01L 29/161; H01L 29/41725; H01L 29/66477; H01L 29/0657; H03C 3/02
See application file for complete search history.

(56) References Cited

U.S. PATENT DOCUMENTS

| | | | |
|---|---|---|---|
| 8,441,000 B2 | 5/2013 | Chen et al. | |
| 2006/0091490 A1* | 5/2006 | Chen et al. | 257/458 |
| 2008/0182371 A1* | 7/2008 | Gehring et al. | 438/199 |

(Continued)

OTHER PUBLICATIONS

Ji-Song Lim, et al., "Comparison of Threshold-Voltage Shifts for Uniaxial and Biaxial Tensile-Stressed n-MOSFETs", IEEE Electron Device Letters, vol. 25, No. 11, Nov. 2004, 3 pages.

(Continued)

*Primary Examiner* — Yu Chen
*Assistant Examiner* — Nilufa Rahim
(74) *Attorney, Agent, or Firm* — Heslin Rothenberg Farley & Mesiti P.C.

(57) ABSTRACT

Tunneling field effect transistors and fabrication methods thereof are provided, which include: obtaining a gate structure disposed over a substrate structure; and providing a source region and a drain region within the substrate structure separated by a channel region, the channel region underlying, at least partially, the gate structure, and the providing including: modifying the source region to attain a narrowed source region bandgap; and modifying the drain region to attain a narrowed drain region bandgap, the narrowed source region bandgap and the narrowed drain region bandgap facilitating quantum tunneling of charge carriers from the source region or the drain region to the channel region. Devices including digital modulation circuits with one or more tunneling field effect transistor(s) are also provided.

14 Claims, 12 Drawing Sheets

(51) Int. Cl.
　　　*H01L 29/08*　　　(2006.01)
　　　*H01L 29/161*　　(2006.01)

(56) References Cited

U.S. PATENT DOCUMENTS

| | | | |
|---|---|---|---|
| 2009/0026553 A1* | 1/2009 | Bhuwalka | H01L 29/66356 257/402 |
| 2011/0084319 A1* | 4/2011 | Zhu | B82Y 10/00 257/288 |
| 2012/0193679 A1 | 8/2012 | Chen et al. | |
| 2013/0037867 A1* | 2/2013 | Adachi | H01L 21/76224 257/288 |

OTHER PUBLICATIONS

D.V. Singh, et al., "Measurement of the Conduction Band Offsets in and Heterostructures Using Metal-Oxide Semiconductor Capacitors", Journal of Applied Physics. 85, 978 (1999), 1 page. (Abstract only).

Chenming Hu, "Green Transistor as a Solution to the IC Power Crisis", ICSICT-9th International Conference on Solid-State and Integrated-Circuit Technology, Oct. 20-23, 2008, pp. 16-20.

S.E. Thompson, et al., "Key Differences for Process-induced Uniaxial vs. Substrate-induced Biaxial Stressed Si and Ge Channel MOSFETs", Electron Devices Meeting, 2004. IEDM Technical Digest. IEEE International, Dec. 13-15, 2004, pp. 221-224.

\* cited by examiner

MODIFIED TUNNELING FIELD EFFECT TRANSISTORS AND FABRICATION METHODS

FIELD OF THE INVENTION

The present invention relates to semiconductor devices and methods of manufacturing semiconductor devices, and more particularly, to tunneling field effect transistors and methods for fabricating tunneling field effect transistors.

BACKGROUND OF THE INVENTION

Modern integrated circuit designs, using conventional transistors, integrate both analog and digital circuit elements in order to combine analog functions, such as radio-frequency transmission, with digital functions, such as logic and memory operations, on a single chip. Tunneling field effect transistors (TFETs), which use band-to-band quantum tunneling of charge carriers, have been proposed to replace existing transistors performing digital functions, because TFETs have faster switching at lower voltage than, for example, conventional field effect transistors.

BRIEF SUMMARY

The shortcomings of the prior art are overcome, and additional advantages are provided, through the provision, in one aspect, of a method for fabricating a tunneling field effect transistor. The fabricating includes: obtaining a gate structure disposed over a substrate structure; and providing a source region and a drain region within the substrate structure separated by a channel region, the channel region underlying, at least partially, the gate structure, and the providing including: modifying the source region to attain a narrowed source region bandgap; and modifying the drain region to attain a narrowed drain region bandgap, the narrowed source region bandgap and the narrowed drain region bandgap facilitating quantum tunneling of charge carriers from the source region or the drain region to the channel region.

In another aspect, a device is presented herein which includes a tunneling field effect transistor, the tunneling field effect transistor being or including: a gate structure disposed over a substrate structure; a source region and a drain region within the substrate structure separated by a channel region, the channel region underlying, at least partially, the gate structure, wherein the source region has a narrow source region bandgap, the drain region has a narrow drain region bandgap, and the channel region has a channel region bandgap, the narrow source region bandgap and the narrow drain region bandgap being narrower bandgaps than the channel region bandgap and facilitating quantum tunneling of charge carriers from the source region or the drain region to the channel region.

In a further aspect, another device is presented herein which includes a modulation circuit, the modulation circuit including: an input configured to receive an input voltage; an output configured to deliver an output current; and a modulation element characterized by a V-shaped current-voltage diagram, the V-shaped current-voltage diagram describing the relationship between the input voltage of the input and the output current of the output.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
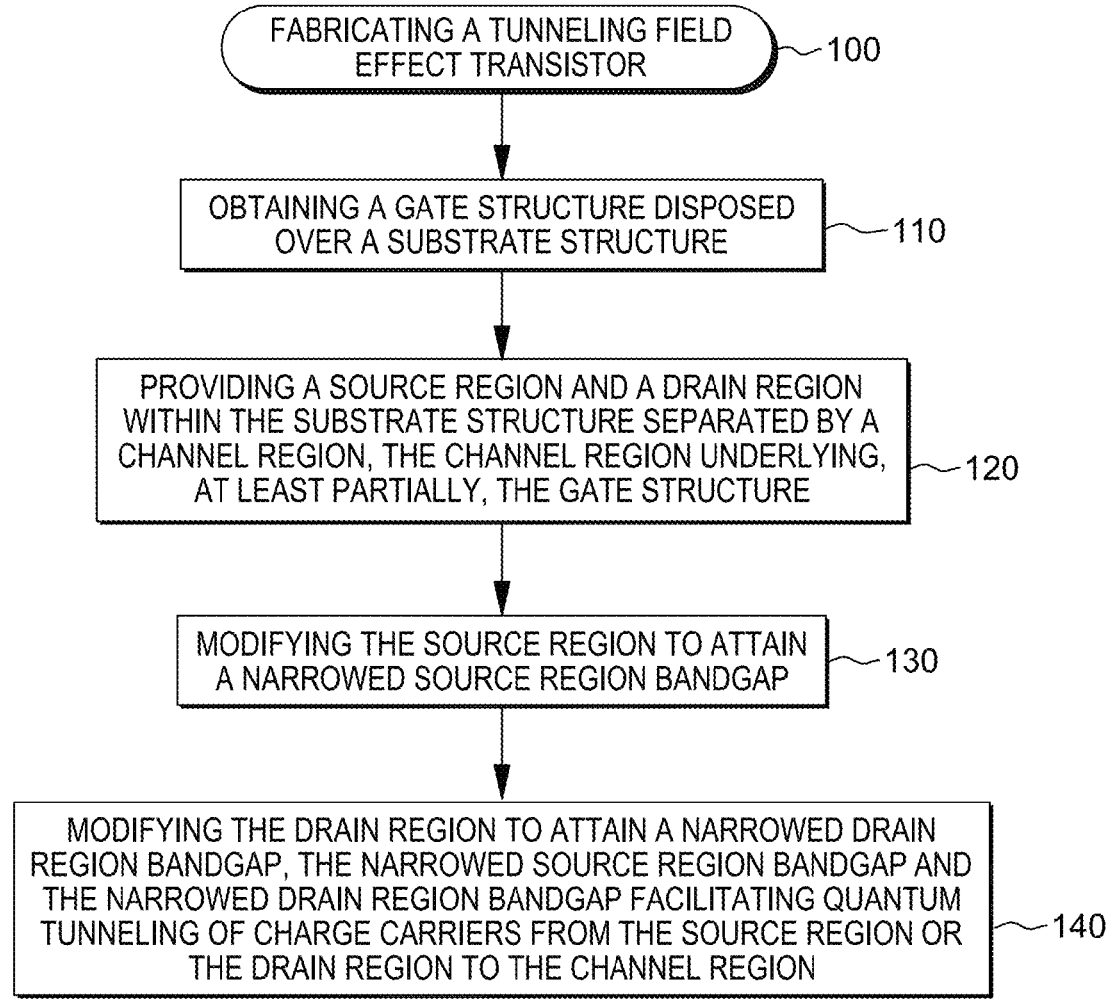
FIGS. 1A-1D depict multiple embodiments of processes for fabricating a tunneling field effect transistor (TFET), in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, tunneling field effect transistors (TFETs) which have been modified by modifying the bandgaps of the source region and the drain region. By contrast with a conventional field effect transistor (FET), in a TFET, charge carriers, such as electrons or holes, tunnel from the source region or the drain region to the channel region. Tunneling, or quantum tunneling, refers to a quantum mechanical physical phenomenon wherein a particle, such as a charge carrier, may tunnel or pass through a barrier, such as an energy potential that would be insurmountable under classical theories of physics. Using the methods and devices disclosed herein, enhanced quantum tunneling of charge carriers may be achieved, as compared with conventional TFETs.

As known, the energy levels of electrons in a semiconductor are grouped into a valence band and a conduction band, which are separated by a bandgap. The valence band represents the energy levels of electrons bound in the atoms of the semiconductor, and the conduction band represents the energy levels of free electrons capable of conducting charge in the semiconductor. The bandgap is defined by the valence band and the conduction band, and represents the energy required for an electron to move from the valence band to the conduction band.

In a TFET, electrons may tunnel from the source region or drain region valence bands to the channel region conduction band, or from the channel region valence band to the source region or drain region conduction bands through an energy barrier, where the thickness of the barrier can be tuned by the influence of the gate bias. Modification of the source region and drain region to attain narrowed source region and drain region bandgaps (e.g., with respect to the bandgaps of the channel area) such as disclosed herein facilitates enhanced quantum tunneling of charge carriers from the source region or the drain region to the channel region with the same gate bias, and allows for TFETs optimized for faster switching and reduced power consumption as compared to conventional TFETs.

Generally stated, provided herein, in one aspect, is an enhanced device which includes a tunneling field effect transistor. The tunneling field effect transistor includes: a gate structure disposed over a substrate structure; a source region and a drain region within the substrate structure separated by a channel region, the channel region underlying, at least partially, the gate structure, wherein the source region has a narrow source region bandgap, the drain region has a narrow drain region bandgap, and the channel region has a channel region bandgap, the narrow source region bandgap and the narrow drain region bandgap being narrower bandgaps than the channel region bandgap and facilitating (or enhancing) quantum tunneling of charge carriers from the source region or the drain region to the channel region. In one example, the narrow source region bandgap and the narrow drain region bandgap may facilitate (or enhance) quantum tunneling of charge carriers from the source region toward the drain region through the channel region. In another example, the narrow source region bandgap and the narrow drain region bandgap are substantially equal bandgaps.

In one embodiment, the source region of the substrate structure is (or includes) a first region of carbon-doped silicon-germanium material, and the drain region of the substrate structure is (or includes) a second region of carbon-doped silicon-germanium material, the carbon-doped silicon-germanium material providing the narrow source region bandgap in the first region and the narrow drain region bandgap in the second region. In a further embodiment, the source region of the substrate structure includes a memorized stress, and the drain region of the substrate structure includes another memorized stress, the memorized stress providing the narrow source region bandgap in the source region and the another memorized stress providing the narrow drain region bandgap in the drain region. In such a case, the memorized stress could be (or include) a stacking fault in the source region of the substrate structure and the other memorized stress could be (or include) another stacking fault in the drain region of the substrate structure (the stacking faults may indicate a memorized or existing tensile stress).

In another aspect, a modulation circuit is provided. The modulation circuit is configured to modulate a frequency or a phase of a carrier wave with a digital signal, and includes: an input configured to receive an input voltage, the input voltage including the carrier wave and the digital signal; an output configured to deliver an output current; and a circuit element being or including at least one tunneling field effect transistor, the circuit element connecting the input to the output and being characterized by a V-shaped current-voltage diagram, the V-shaped current-voltage diagram describing the relationship between the input voltage of the input and the output current of the output.

In one embodiment, the circuit element may be or include a tunneling field effect transistor characterized by the V-shaped current voltage diagram, the tunneling field effect transistor including: a gate structure disposed over a substrate structure; a source region and a drain region within the substrate structure separated by a channel region, the channel region underlying, at least partially, the gate structure, where the source region includes a narrow source region bandgap, the drain region includes a narrow drain region bandgap, and the channel region includes a channel region bandgap, the narrow source region bandgap and the narrow drain region bandgap being narrower bandgaps than the channel region bandgap and facilitating (or enhancing) quantum tunneling of charge carriers from the source region or the drain region to the channel region.

In another embodiment, the circuit element may be or include a first tunneling field effect transistor connected to a second tunneling field effect transistor, where the first tunneling field effect transistor is characterized by a positive voltage branch of the V-shaped current-voltage diagram and the second tunneling field effect transistor is characterized by a negative branch of the V-shaped current voltage diagram.

Reference is made below to the drawings, which are not drawn to scale for ease of understanding, wherein the same reference numbers used throughout different figures designate the same or similar components.

FIG. 1A depicts one embodiment of a process for fabricating a tunneling field effect transistor 100. In the embodiment depicted, the fabricating includes: obtaining a gate structure disposed over a substrate structure 110; and providing a source region and a drain region within the substrate structure separated by a channel region, the channel region underlying, at least partially, the gate structure 120; and the providing including: modifying the source region to attain a narrowed source region bandgap 130; and modifying the drain region to attain a narrowed drain region bandgap, where the narrowed source region bandgap and the narrowed drain region bandgap facilitate quantum tunneling of charge carriers from the source region or the drain region to the channel region 140.

In one example, the channel region has an unmodified channel region bandgap, and both the narrowed source region bandgap and the narrowed drain region bandgap are narrower bandgaps than the unmodified channel region bandgap. In such a case, both the narrowed source region bandgap and the narrowed drain region bandgap are between 60 and 400 meV narrower than the unmodified channel region bandgap. In another example, the narrowed source region bandgap and the narrowed drain region bandgap are substantially equal bandgaps. In a further example, one of the source region or the drain region could be or include an n-type material and the other of the source region or the drain region could be or include a p-type material. In one specific example, the source region of the substrate structure includes a first region of carbon-doped silicon-germanium material, and the drain region of the substrate structure includes a second region of carbon-doped silicon-germanium material, the carbon-doped silicon-germanium material providing the narrowed source region bandgap in the first region and the narrowed drain region bandgap in the second region.

In another example, a source region junction may be located between the source region and the channel region, and a drain region junction may be located between the drain region and the channel region. In such a case, the gate structure may overlap either or both of the junctions. In one specific example, the gate structure may overlap either or both of the junctions by approximately 10 nanometers. By way of explanation, when the junction is overlapped by the gate, the band-structure of the junction may be bent by the gate bias. For example, a TEFT with only one junction overlapped by the gate may only trigger one type of tunneling (i.e. electron or hole tunneling), and a TEFT with both junctions overlapped by the gate may trigger both types of tunneling (both electrons and holes) at source and drain junctions.

Figure 1B:
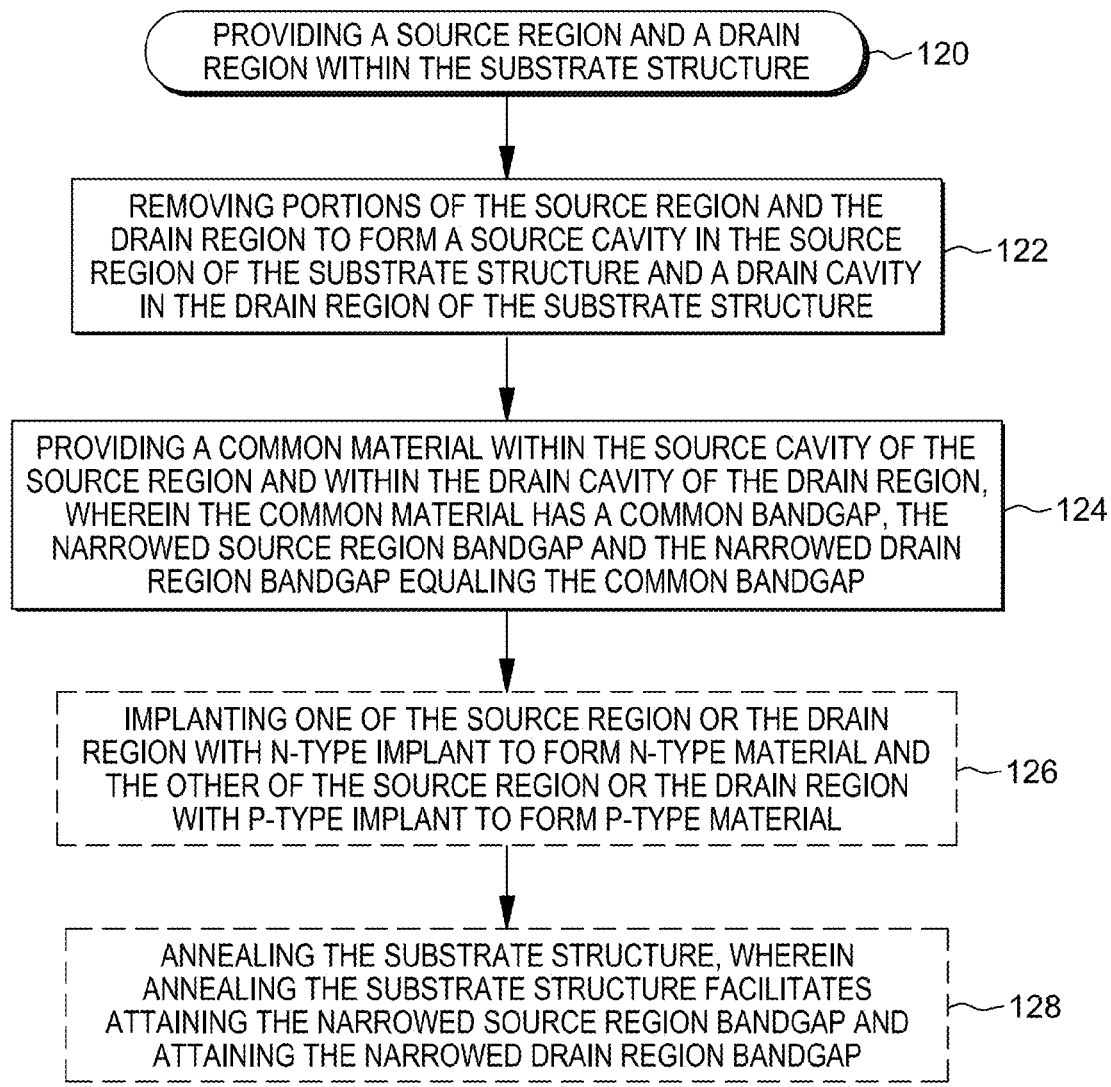

FIG. 1B depicts other embodiments of processes for fabricating a tunneling field effect transistor, in accordance with one or more aspects of the present invention. As depicted, modifying the source region and modifying the drain region may include: removing portions of the source region and the drain region to form a source cavity in the source region of the substrate structure and a drain cavity in the drain region of the substrate structure 122; and providing a common material within the source cavity of the source region and the drain cavity of the drain region, wherein the common material has a common bandgap, the narrowed source region bandgap and the narrowed drain region bandgap equaling or being the common bandgap 124. In such a case, for instance, the common material could be or include a carbon-doped silicon-germanium material.

In another embodiment, modifying the source region and modifying the drain region of the substrate structure could further include, after providing the common material within the source cavity and the drain cavity, implanting one of the source region or the drain region with an n-type implant to form n-type material and the other of the source region or the drain region with a p-type implant to form p-type material 126. In a further embodiment, modifying the source region and modifying the drain region may further include, after implanting, annealing the substrate structure, wherein annealing the substrate structure facilitates attaining the narrowed source region bandgap and the narrowed drain region bandgap 128. In such a case, the common material may be or include silicon-germanium, the n-type implant (the implant at the n-type active region) may be or include carbon and n-type dopants (for example, carbon with phosphorous or arsenic), and the p-type implant (the implant at the p-type active region) may be or include carbon and p-type dopants (for example, carbon with boron or $BF_2$).

Figure 1C:
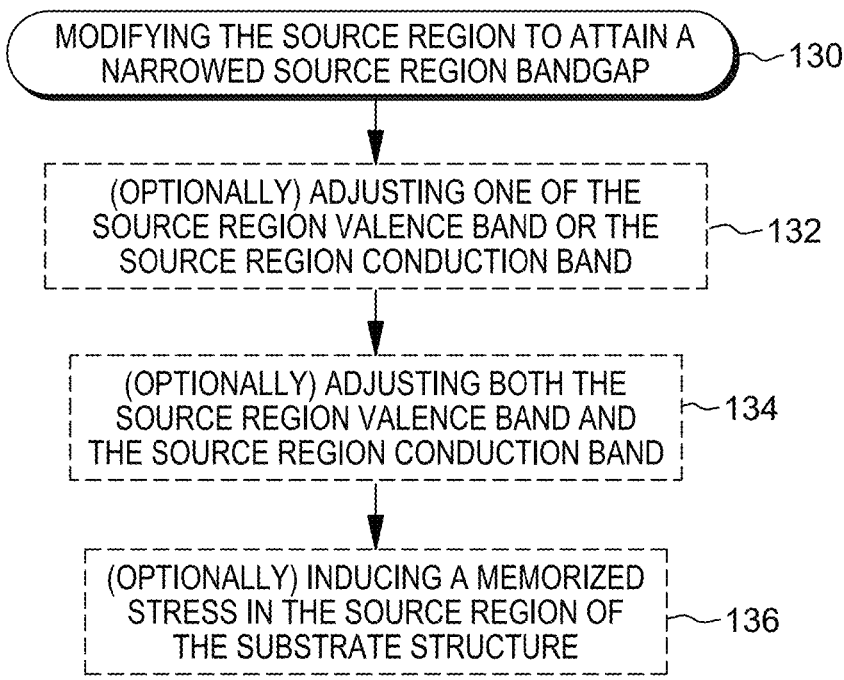

FIG. 1C depicts further embodiments of processes for fabricating a tunneling field effect transistor. In one embodiment, for example, the source region bandgap is defined by a source region valence band and a source region conduction band, and modifying the source region to attain the narrowed source region bandgap includes adjusting one of the source region valence band or the source region conduction band 132. For example, in one instance, modifying the source region to attain the narrowed source region bandgap could include adjusting both the source region valence band and the source region conduction band 134. In another instance, modifying the source region to attain the narrowed source region bandgap could include inducing a memorized stress in the source region of the substrate structure 136. In such a case, the memorized stress could be a stacking fault in the source region of the substrate structure.

Figure 1D:
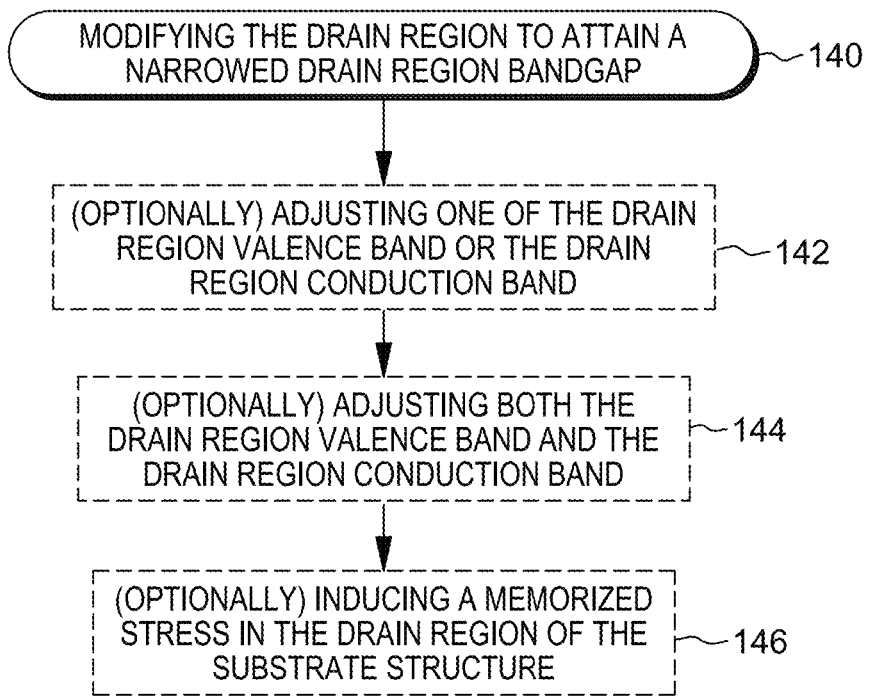

FIG. 1D depicts other embodiments of processes for fabricating a tunneling field effect transistor. In one embodiment, as depicted, the drain region bandgap is defined by a drain region valence band and a drain region conduction band, and modifying the drain region to attain the narrowed drain region bandgap includes adjusting one of the drain region valence band or the drain region conduction band 142. By way of example, modifying the drain region to attain the narrowed drain region bandgap could include adjusting both the drain region valence band and the drain region conduction band 144. In another example, modifying the drain region to attain the narrowed drain region bandgap could include inducing another memorized stress in the drain region of the substrate structure 146. In such an example, the other memorized stress could be another stacking fault in the drain region of the substrate structure.

Applicant will now explain the properties of TFETs, including physical structure, electrical characteristics, and current-voltage behavior.

Figure 2:
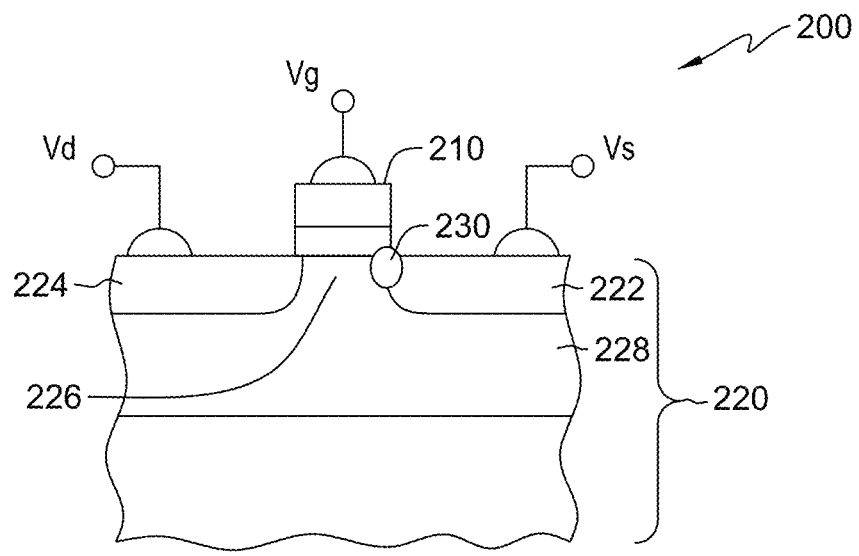
FIG. 2 depicts one embodiment of a TFET, which may be modified, in accordance with one or more aspects of the present invention.

FIG. 2 illustrates one embodiment of a TFET 200, operating with n-type (electron) tunneling current. TFET 200 includes a gate structure 210 disposed over a substrate structure 220, which has a source region 222 and a drain region 224, separated by a channel region 226. Source region 222 may be a heavily doped p+-type semiconductor, drain region 224 may be a heavily doped n+-type semiconductor, and channel region 226 may be a lightly doped n-type semiconductor in an n-well 228, as one example. In one example, the gate structure 210 overlaps the source region 222, by a distance of, for instance, 10 nanometers, and may or not overlap drain region 224. In such an example, TFET 200 is an n-type TFET device. In operation of n-type (electron) tunneling at source junction in TFET 200, electrons may tunnel from source region 222 and drain region 224 to channel region 226 through junction 230. For instance, in operation of an n-type (electron) tunneling in TFET, the band-bending at (e.g., source to channel) at source junction 230 may be enhanced by a positive gate voltage (with respect to the potential at source region 222) so that electrons in a valence band of source region 222 may be tunneling into the conduction band of the source region 222 near junction 230, drift into channel 226 (in accumulation of electrons), and be collected by drain region 224. Note that in such a case, the drain region 224 (which may be heavily n-type doped) may be electrically connected to channel region 226 (which may be lightly n-type doped) and n-well 228. Typically, substrate 220 below n-well 228 is a p-type semiconductor (such as Si). In other examples, electron tunneling at source junction 230 may occur if channel region 225 is not doped or even slightly p-type doped.

As known, in a conventional FET, both the source region and the drain region have the same doping type, but by contrast, in a TFET, the source region and the drain region have opposite doping types.

Figure 3:
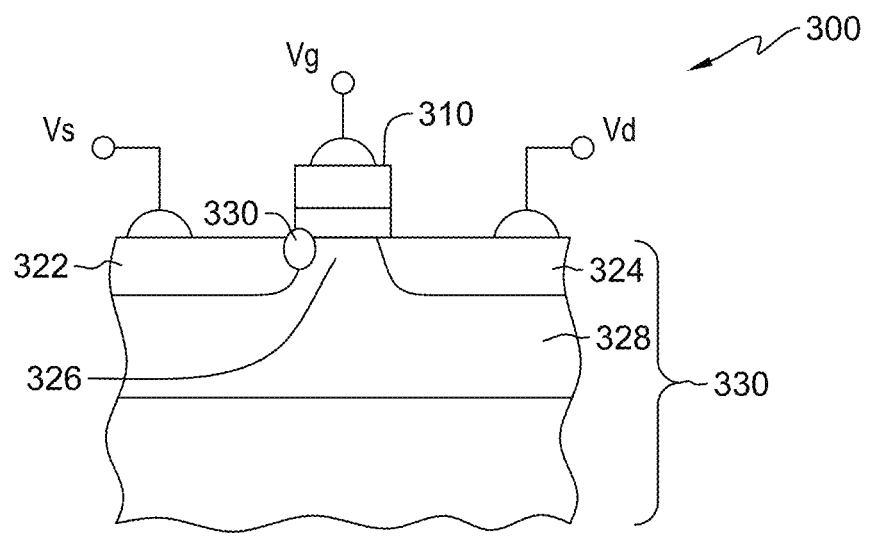
FIG. 3 depicts another embodiment of a TFET, which may be modified, in accordance with one or more aspects of the present invention.

FIG. 3 illustrates another embodiment of a TFET 300 operating with p-type (hole) tunneling current. By contrast with TFET 200 (FIG. 2), all three regions, namely a source region 322, a drain region 324, and a channel region 326, are assumed to have opposite conductivity types as the corresponding regions of TFET 200. For instance, source region 322 may be a heavily doped n+-type semiconductor, drain region 324 may be a heavily doped p+-type semiconductor, and channel region 326 may be a lightly doped p-type semiconductor. In one example, the gate structure 310 overlaps source region 322 by a distance of, for instance, 10 nanometers, and may or may not overlap drain region 324. Such a configuration, which is operating by p-type (hole) tunneling, may be achieved by including a p-well 328 within substrate 320. The substrate 320 below the p-well 328 is typically a p-type semiconductor (such as Si). In operation of a p-type (hole) tunneling in TFET 300, holes may tunnel from the source region 322 toward the drain region 324 and channel region 326 through tunneling junction 330. In operation of p-type (hole) tunneling in TFET 300, the band-bending at (e.g., source to channel) junction 330 may be enhanced by a negative gate voltage (with respect to the potential at source region 322) so that holes in the conduction band of source region 322 may be tunneling into the valence band of the source region 322 near junction 230, drift into channel region 326, and be collected by drain region 324. Note that in such a case, drain region 324 may be electrically connected to channel region 326 and the p-well 328. In other examples, hole tunneling at source junction 330 may occur if channel region 225 is not doped or even slightly n-type doped.

Figure 4A:
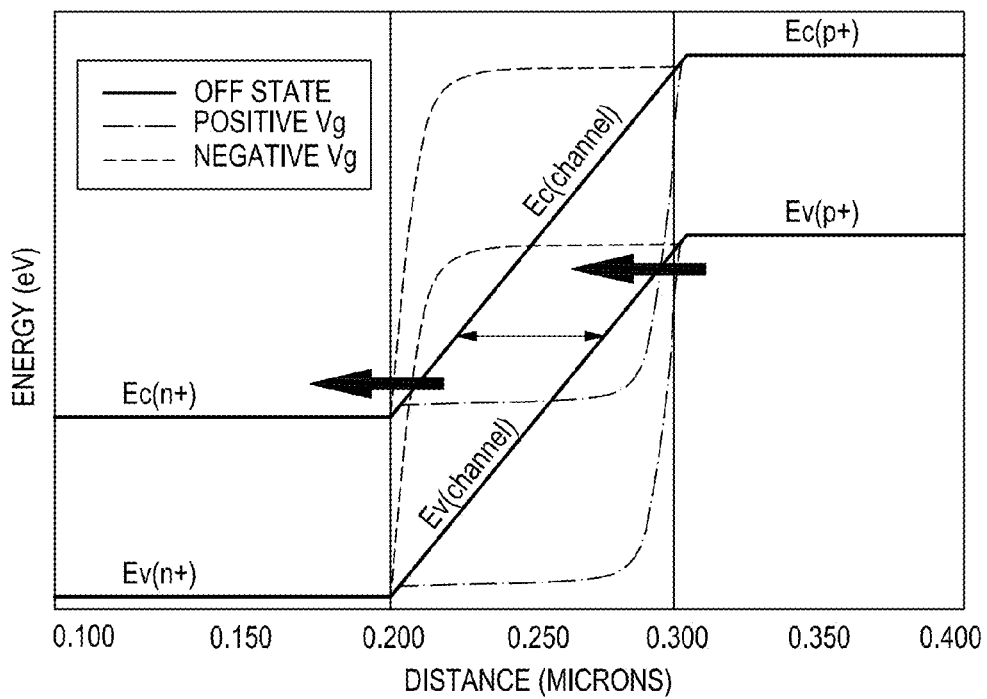
FIG. 4A is an energy band diagram depicting the electrical properties of a TFET, in accordance with one or more aspects of the present invention.

FIG. 4A is an energy band diagram illustrating electrical properties of a typical TFET, including an n-type TFET, such as TFET 200 (FIG. 2) and a p-type TFET, such as TFET (FIG. 3). As known, the energy bands of a semiconductor will shift depending on the voltage bias applied on the terminals, but the bandgap, which is defined by the $E_C$-$E_V$, does not change simply because of the voltage bias.

Visually, by convention, the diagram of FIG. 4A illustrates that the p+ region, on the right hand side, has energy bands higher with respect to the energy bands of the n+ region on the left hand side. The middle channel region is either undoped or lightly doped, and its energy bands may bend by the gate voltage. With negative gate voltage, the band bending of the channel region is close to the n+ region, and with positive gate voltage, the band bending is close to the p+ region. In each case, the gate voltage induces a sharp band bending (i.e., small tunneling distance resulted between the conduction and valence band edges) near the junctions between the n+ region and the channel region, or the p+ region and the channel region. This facilitates band-to-band quantum tunneling of electrons from the valence band of the p+ source (or the drain) to the conduction band of the n+ drain (or the source), to be the mechanism of charge carrier injection in the TFET. If, for example, the band gap at the junction is narrowed as described herein, quantum tunneling will be further enhanced. In contrast, in a conventional FET, the charge carriers in the source inject over the energy barrier of the channel region, in a mechanism known as thermal-ionic transportation.

Specifically, with respect to the energy band diagram of FIG. 4A, in an n-type TFET, when a positive gate voltage ($V_g$) (with respect to the source) is greater than a threshold voltage ($V_t$), electrons with energy $E_V$(p+) may tunnel from the valence band in the p+-region, such as a source region, to a conduction band in the channel region with energy $E_C$(channel), and drift into the drain region. In a p-type TFET, when $V_g$ is less negative (with respect to the source), electrons with energy $E_V$(channel) may tunnel from the valence band in the channel region to the conduction band in an n+-region, such as the source region, with energy $E_C$(n+).

Figure 4B:
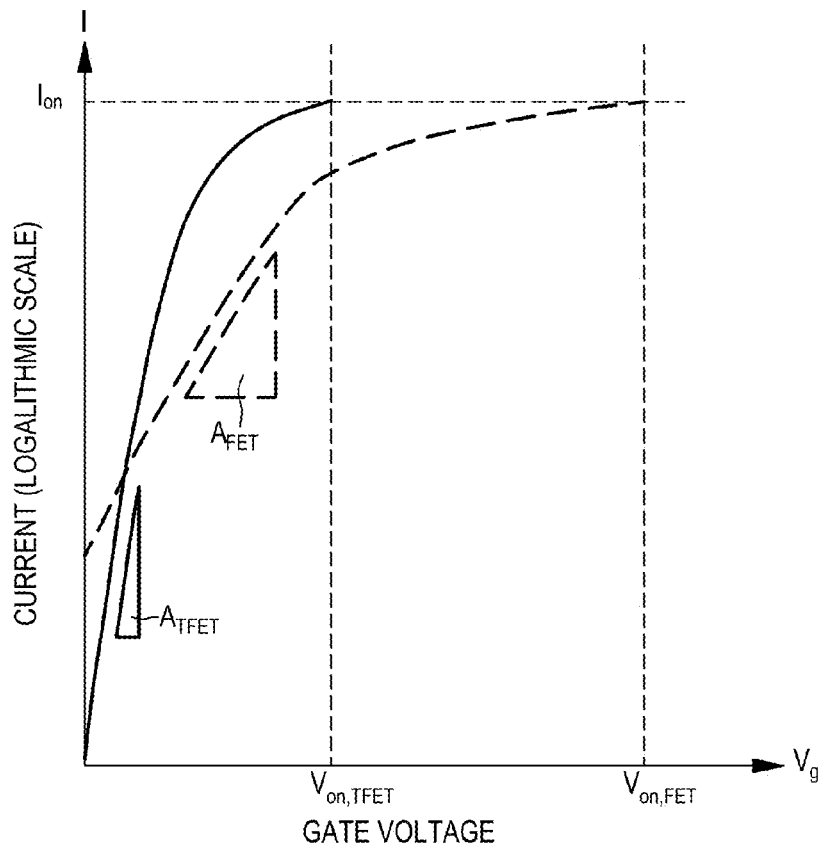
FIG. 4B is a current-voltage diagram comparing the electrical properties of a TFET with those of a conventional FET.

FIG. 4B is a current-voltage diagram comparing the current-voltage curve of a TFET with a current-voltage curve of a conventional FET. The current-voltage curve of the FET shows the current flowing between a source region and a drain region of the FET as a function of the gate voltage $V_g$. As known, in a current-voltage curve, the slope of the current with respect to the voltage at the sub-threshold region is called the sub-threshold slope (SS), and a TFET could have a smaller SS than a conventional FET.

For digital applications, a FET operates in one of an on-state or an off-state. In the on-state, $V_g$ must equal an on-voltage $V_{ON}$ that is high enough to allow a specified on-current $I_{ON}$ to flow between the source region and the drain region, representing a digital "1." In the off-state $V_g$ is zero volts, and no current flows between the source region to the drain region, representing a digital "0." As illustrated, from $I_{OFF}$ to $I_{ON}$, a TFET requires less voltage than a conventional FET. Since a TFET requires a lower voltage to operate in the on-state, a TFET allows a smaller operating voltage ($V_{dd}$) and hence uses less energy than a conventional FET, because power consumption of circuits scales down with a smaller $V_{dd}$.

By contrast with digital operation, in analog operation of a FET, $V_g$ may be set to any value, such as any value between zero volts and $V_{ON}$, and the FET is an amplifier, allowing small gate voltage variations to be amplified into large varying output currents.

Figure 5:
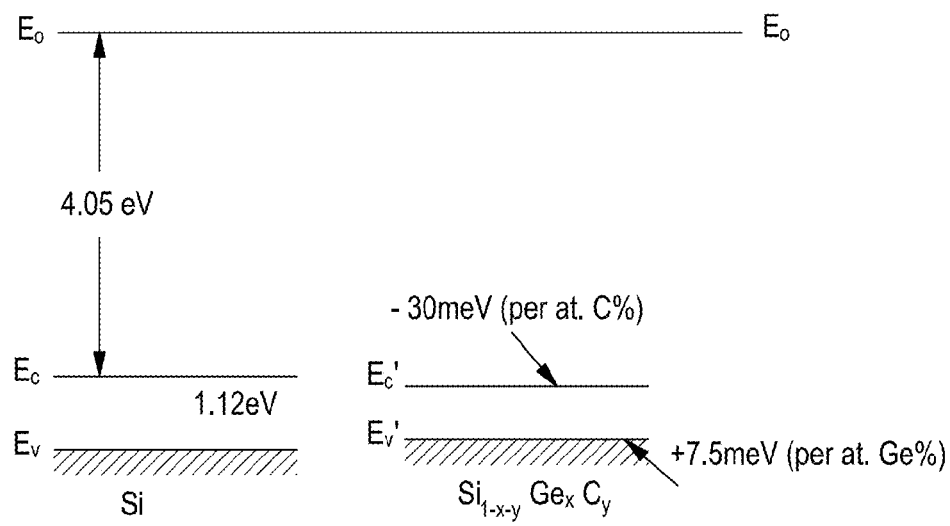
FIG. 5 is an energy band diagram of various materials.

One way to modify the bandgap of a TFET is by selecting or forming the TFET with materials having the desired bandgap. FIG. 5 is an energy band diagram, illustrating the energy bands and bandgaps of various materials at a standard temperature of 300 K. As known, at standard temperature, the bandgap of silicon is 1.12 electron volts (eV), and the electron affinity of silicon, or the energy required to remove a conduction electron from silicon into vacuum, is 4.05 eV. The bandgap of a material is defined by a valence band and a conduction band, as $E_C$-$E_V$, and represents the minimal amount of energy required to free a bound electron from an atom of the material.

By way of example, a carbon-doped silicon-germanium material or alloy may be denoted as $Si_{1-x-y}Ge_xC_y$, where the material has (1-x-y) atomic percentage (%) silicon (Si), x% germanium (Ge), and y% carbon (C). $Si_{1-x-y}Ge_xC_y$ may have a narrowed bandgap, or $E^1_C$-$E^1_V$, that is the conduction band edge $E^1_C$ is lowered by 30 meV per atomic percentage of carbon (y times 30 meV) and the valence band edge $E^1_V$ is larger by 7.5 meV per atomic percentage of germanium (x times 7.5 meV).

In the above examples, the narrowed bandgap may be attained by adjusting one or both of the valence band or the conduction band. For example, reducing the conduction band energy (by, for example, C content), or increasing the valence band energy (by, for example, Ge content) could both reduce the bandgap.

Figure 6:
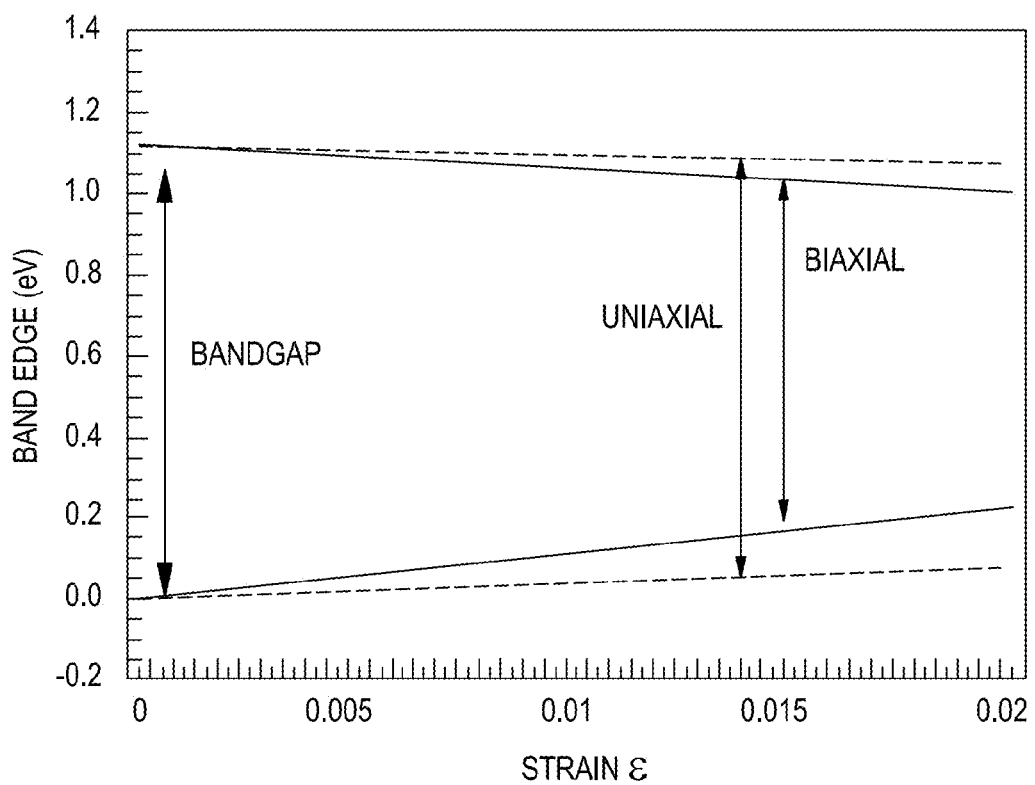
FIG. 6 graphically depicts strain dependency of the bandgap of silicon.

Another way to modify the bandgap of a TFET is by inducing a tensile strain in the material of the TFET. FIG. 6 graphically depicts strain dependency of the bandgap of silicon. As illustrated, for example, a biaxial strain of 0.01 (1%) could reduce the bandgap of silicon by 230 meV, and a uniaxial strain of 0.01 (1%) could reduce the bandgap of silicon by 88 meV.

Figure 7A:
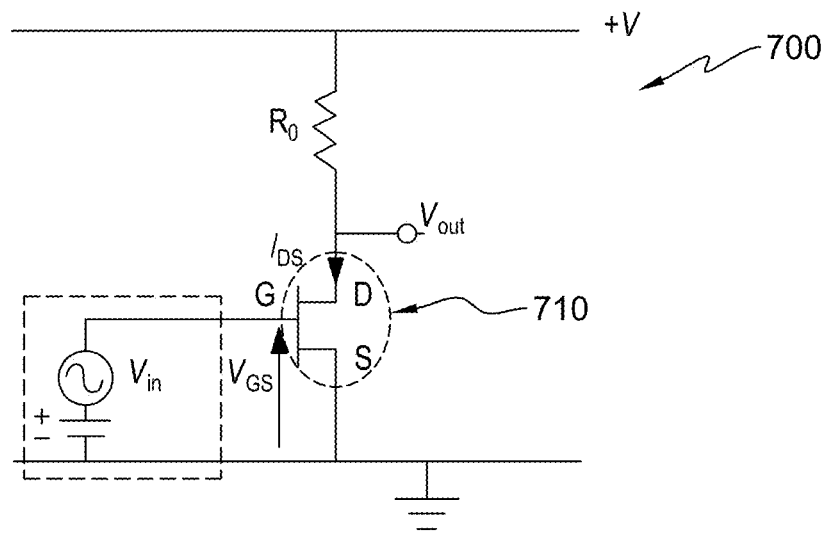
FIG. 7A is a circuit diagram of one embodiment of a digital modulation circuit, in accordance with one or more aspects of the present invention.

From the above description, if the gate structure could overlap both the source region and the drain region, then the TFET structure can trigger both n-type (electron) and p-type (hole) tunneling in a single device. For example, the TFET may turn on by biasing gate bias either at high (Vcc) or low (Vs). The current-voltage diagram of the TFET with a gate structure overlapping (for example, atop) both junctions may then achieve a V-shaped curve as illustrated in FIG. 7C. In such a case, the gate bias may be wider in range from lower than Vs to higher than Vcc for larger driver currents.

As noted, one advantage of a TFET of the present invention is that it may be optimized for analog operation, for example, transmitting digital data over an analog transmission medium. FIG. 7A is one embodiment of a circuit diagram of a digital modulation circuit 700, that uses a circuit element including a single TFET 710 tuned to be characterized by the current-voltage diagram of FIG. 7C. In one example, TFET 710 may have narrowed source region and drain region bandgaps facilitating quantum tunneling of charge carriers from the source region or the drain region to the channel region of TFET 710. In such a case, a gate structure of TFET 710 may overlap both a source region junction and a channel region junction adjoining the channel region.

Modulation circuit 700 may be used to transmit digital information, for example, via an analog radio-frequency (RF) signal. The purpose of modulation circuit 700 is to modulate a carrier signal wave to represent digital "0s" and digital "1s." Modulation circuit 700 is one example of an analog circuit that may be included in an integrated circuit that integrates both analog and digital functions. Typically a modulation circuit may be used in conjunction with a demodulation circuit, which is designed to receive digital information from an RF signal.

In one example of modulation technology for transmittal of digital information over an RF signal, known as frequency-shift keying, the frequency of the RF signal represents the digital information. For example, an RF signal of frequency f for a time period T could represent a digital "1," and an RF signal of frequency 2f for time period T could represent a digital "0."

In another example, known as phase-shift keying, the phase of the RF signal represents the digital information. For example, an RF signal of frequency f and phase angle φ for time period T could represent a digital "1," and an RF signal of frequency f and phase angle (180°-φ) for time period T could represent a digital "0."

In operation of modulation circuit 700, an alternating current (AC) sinusoidal carrier signal wave $V_{carrier}$ having constant frequency f and constant phase angle φ is added to a direct current (DC) voltage representing the digital information, and fed into the input of modulation circuit 700, which produces the output voltage, which is the RF signal.

For example the DC voltage representing the digital information may be either a first DC voltage $V^0$ for time period T, representing a digital "0" or a second DC voltage $V^1$ for time period T representing a digital "1." To transmit a digital "0," $V_{in}$ is set equal to $V^0+V_{carrier}$, and to transmit a digital "1," $V_{in}$ is set equal to $V^1+V_{carrier}$.

Figure 7B:
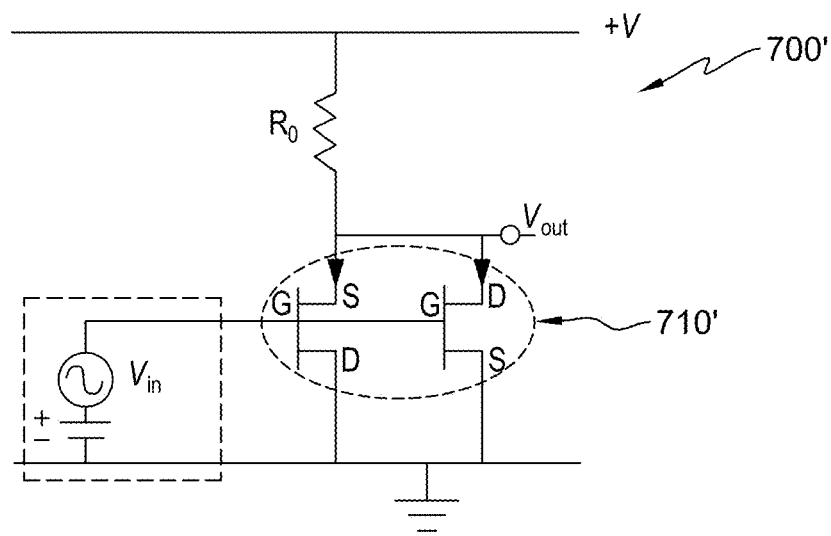
FIG. 7B is a circuit diagram of another embodiment of a digital modulation circuit, in accordance with one or more aspects of the present invention.
Figure 7C:
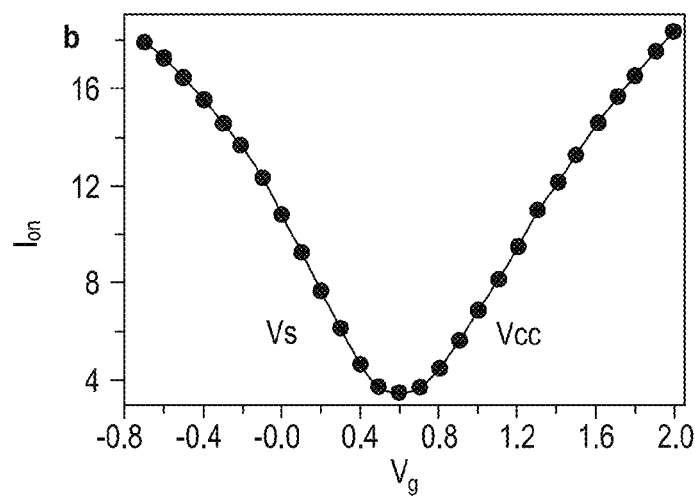
FIG. 7C is a current-voltage diagram depicting the electrical properties of a TFET optimized for analog operation, in accordance with one or more aspects of the present invention.

FIG. 7B is another embodiment of a digital modulation circuit 700'. By contrast with modulation circuit 700 (FIG. 7A), modulation circuit 700' includes a pair of TFETs 710'. In one example, the pair of TFETs 710' may include an n-type TFET and a p-type TFET. One of the pair of TFETs 710' may be characterized by a positive slope branch of the current-voltage diagram of FIG. 7C, and the other of the pair of TFETs 710' may be characterized by a negative slope branch of the current-voltage diagram of FIG. 7C. In such a case, gate structures of the pair of TFETs 710' may only overlap the source regions of the respective TFET.

FIG. 7C is a current-voltage diagram describing the electrical properties of the TFET optimized for analog operations. By contrast with the current-voltage diagrams of FIG. 4B, FIG. 7C illustrates that the TFET current-voltage diagram has a region with positive slope and a region with negative slope. Unlike conventional FET or typical TFET current-voltage diagrams, this current-voltage diagram illustrates that both the source junction and drain junction have been optimized for high (tunneling) driving current. When used for digital applications (in only the on-state or off-state), such a configuration would undesirably lead to increased gate induced drain leakage (GIDL). However, such a current-voltage diagram may be useful for analog functions, such as the modulation circuit of FIG. 7A, where the TFET is operated throughout its voltage range, and not only in the on-state and off-state.

Figure 7D:
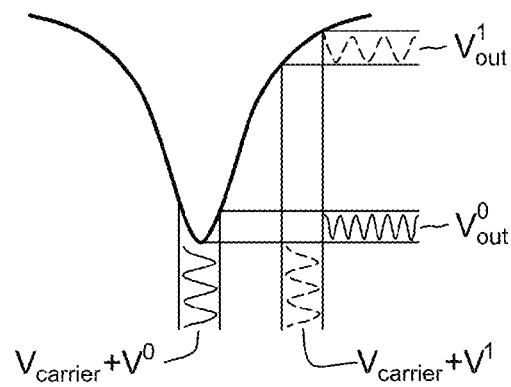
FIG. 7D depicts a binary frequency-shift keying operation using the digital modulation circuit of FIG. 7A, in accordance with one or more aspects of the present invention.

FIG. 7D illustrates the input/output behavior of modulation circuit 700 (FIG. 7A), which includes TFET 710 (FIG. 7A) which is optimized for analog operation and has the current-voltage diagram of FIG. 7C. Specifically, in this example, the modulation circuit is used for frequency-shift keying, as described above.

As illustrated, $V^0$ is set equal to a DC value equal to the minimum of the current-voltage curve of FIG. 7C (approximately 0.6 V), representing a digital "0," and $V^1$ is set equal to a positive voltage (approximately 1.5 V) representing a digital "1."

To send a digital "0," $V_{in}$ is set equal to $V_{carrier}+V^0$. In such a case, TFET 710 (FIG. 7A) acts as a rectifier or frequency-doubler, because it is operated on both sides of the minimum of its current-voltage curve, and produces an output $V^0_{out}$ with a frequency 2$f$. This is because the positive portion of $V_{in}$ multiplies by the positive slope of the current-voltage curve to yield a positive output, and the negative portion of $V_{in}$ multiplies by the negative slope of the current-voltage curve to also yield a positive output.

To send a digital "1," $V_{in}$ is set equal to $V_{carrier}+V^1$. In such a case, TFET 710 (FIG. 7A) operates in its positive slope linear region, and produces an output $V^1_{out}$ with an unchanged frequency f, because $V_{in}$ is multiplied by the positive slope only.

Figure 7E:
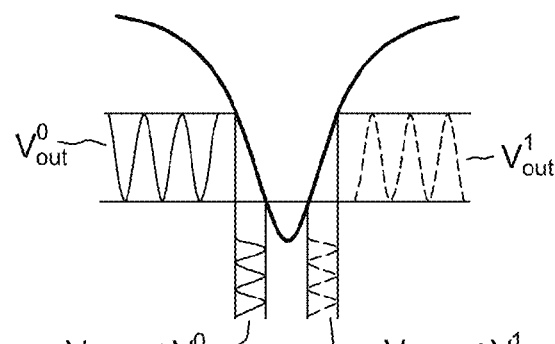
FIG. 7E depicts a binary phase-shift keying operation using the digital modulation circuit of FIG. 7A, in accordance with one or more aspects of the present invention.

FIG. 7E illustrates another example of the input/output behavior of the modulation circuit of FIG. 7A. Specifically, in this example, the modulation circuit is used for phase-shift keying.

As illustrated, $V^0$ is set equal to a negative voltage (approximately 0.2V) representing a digital "0" and $V^1$ is set equal to a positive voltage (approximately 1.0 V) representing a digital "1."

To send a digital "0," $V_{in}$ is set equal to $V_{carrier}+V^0$. In such a case, TFET 710 (FIG. 7A) operates in its negative slope linear region and produces an output $V^0_{out}$ with an opposite sign and therefore a phase angle of 180°-φ.

To send a digital "1," $V_{in}$ is set equal to $V_{carrier}+V^1$. In such a case, TFET 710 (FIG. 7A) operates in its positive slope linear region, and produces an output $V^1_{out}$ with an unchanged sign and therefore unchanged phase angle of φ.

FIGS. 8A-8F illustrate embodiments of methods for fabricating a modified TFET having narrowed bandgaps, which, in one embodiment, may achieve the current-voltage curve of FIG. 7C.

Figure 8A:
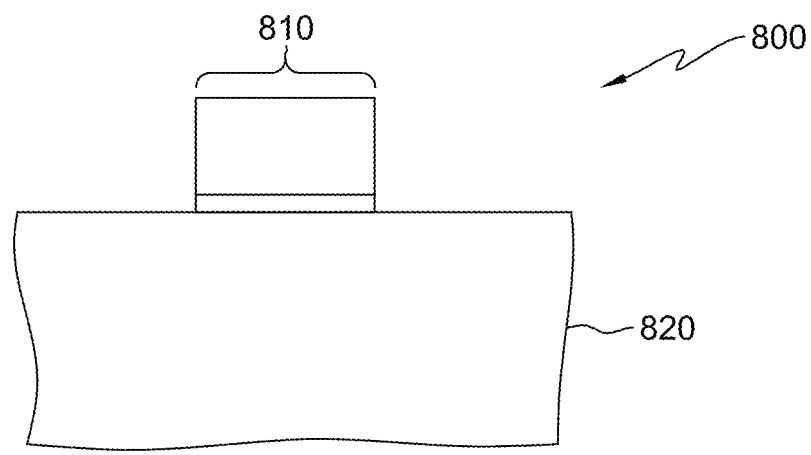
FIG. 8A is a cross-sectional elevational view of one embodiment of a structure obtained during TFET fabrication, in accordance with one or more aspects of the present invention.

FIG. 8A is a cross-sectional elevational view of one embodiment of a structure 800 obtained during TFET fabrication, in accordance with one or more aspects of the present invention. As illustrated, a gate structure 810 is disposed over a substrate structure 820. A source region and a drain region have been provided within substrate structure 820, separated by a channel region. The channel region underlies, at least partially, gate structure 810. Taken together, the channel region, the source region, the drain region, and gate structure 810, form a tunneling field effect transistor (TFET).

Substrate structure 820 may be or include a bulk semiconductor material such as a bulk silicon wafer. As another example, substrate 820 may be or include any silicon-containing substrate including, but not limited to, single crystal Si, polycrystalline Si, amorphous Si, Si-on-nothing (SON), Si-on-insulator (SOI), or Si-on-replacement insulator (SRI) substrates and the like, and may be n-type or p-type doped as desired for a particular application. In one example, substrate structure 820 may be, for instance, a wafer or substrate approximately 600-700 micrometers thick, or less.

Gate structure 810 may be or may facilitate formation of the gate of the tunneling field effect transistor. For instance, gate structure 810 may be or include a sacrificial gate, such as a polycrystalline silicon (polysilicon) sacrificial gate, which is to be removed and replaced with a replacement metal gate as part of a gate-last fabrication process. Alternatively, gate structure 810 may be final gate structure formed, for instance, as part of a gate-first fabrication process. Gate structure 810, may be formed, using, for example, patterning, such as photolithographic patterning, followed by any suitable deposition process, such as atomic layer deposition (ALD), chemical vapor deposition (CVD), physical vapor deposition (PVD), or the like.

FIGS. 8B-8E illustrate, in part, various embodiments of processes for modifying the source region of substrate structure 820 to attain a narrowed source region bandgap, and modifying the drain region of substrate structure 820 to attain a narrowed drain region bandgap.

Figure 8B:
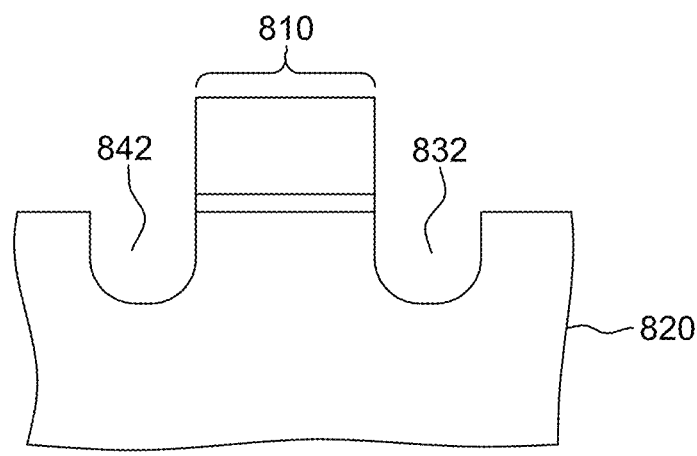
FIG. 8B depicts the structure of FIG. 8A after removing portions of a source region and a drain region to form a source cavity in a source region of the substrate structure and a drain cavity in a drain region of the substrate structure, in accordance with one or more aspects of the present invention.

FIG. 8B illustrates the structure of FIG. 8A after removing portions of the source region and the drain region to form a source cavity 832 in the source region of substrate structure 820 and a drain cavity 842 in the drain region of substrate structure 820.

Source cavity 832 and drain cavity 834 may be formed, for instance, by patterning and etching substrate structure 820 adjacent to gate structure 810. For example, the patterning could be carried out using standard photolithographic techniques, and the etching could be anisotropic etching, such as reactive ion etching (RIE) or plasma etching, using gases highly reactive to the material of substrate structure 820, such as tetrafluoromethane ($CF_4$), sulfur hexafluoride ($SF_6$), boron chloride, ($BCl_3$), or nitrogentrifluoride ($NF_3$).

Figure 8C:
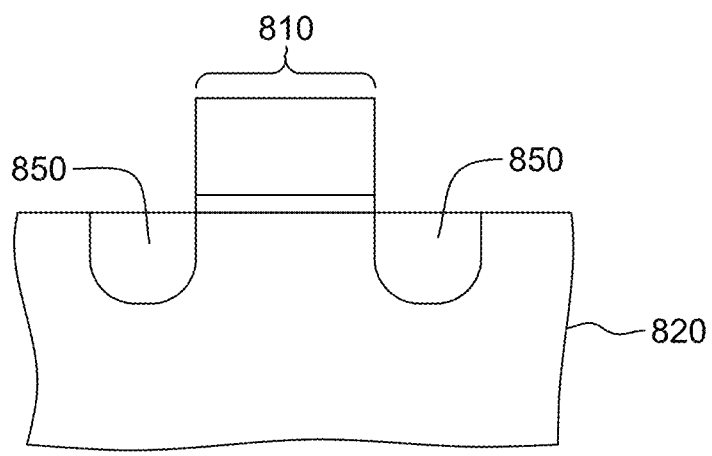
FIG. 8C depicts the structure of FIG. 8B after providing a common material within the source cavity and the drain cavity, in accordance with one or more aspects of the present invention.

FIG. 8C illustrates the structure of FIG. 8B after providing a common material 850 within source cavity 832 (FIG. 8B) of the source region of substrate structure 820 and drain cavity 834 of the drain region of substrate structure 820. Common material 850 may be or include carbon-doped silicon-germanium or silicon-germanium, and may have a narrowed bandgap as compared with the material of substrate structure 820, as described with respect to FIG. 5. The narrowed source region bandgap and the narrowed drain region bandgap may be equal to the bandgap of common material 850. In one example, as explained with reference to FIG. 5, in one example, the common material could be $Si_{1-x-y}Ge_xC_y$, with y between 0% and 2.5% and x between 0% and 50%, yielding a bandgap that is between 0 meV and 225 meV narrower than, for example, a silicon substrate structure 820.

Common material 850 may be provided by any suitable deposition process, such as by epitaxially growing common material 850 within source cavity 832 and drain cavity 842. For example, epitaxial growth within source cavity 832 may occur from revealed surfaces of substrate 820 within source cavity 832 (FIG. 8B), and epitaxial growth within drain cavity 842 may occur from revealed surfaces of substrate 820 within drain cavity 842 (FIG. 8B).

Figure 8D:
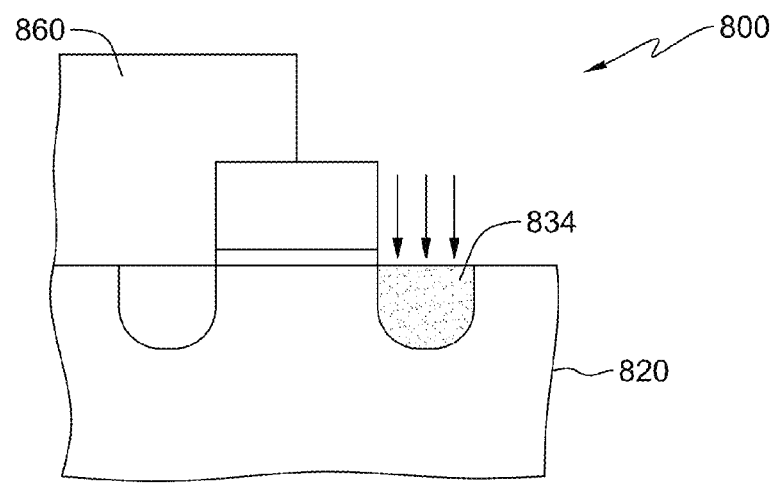
FIG. 8D depicts the structure of FIG. 8C after providing a protective mask, and implanting the source region with an n-type implant to form an n-type material, in accordance with one or more aspects of the present invention.

FIG. 8D illustrates the structure of FIG. 8C after providing a protective mask 860 and implanting the source region of substrate structure 820 with an n-type implant to form n-type material 834. The n-type implant may be, for example, donor atoms, such as phosphorous, arsenic, etc., or may be an n-type doped material, such as, for example carbon and n-type dopants.

In one particular example, common material 850 may be carbon-doped silicon-germanium, and the n-type implant may be donor atoms, such as phosphorous or arsenic. In another example, common material 850 may be silicon-germanium, and the n-type implant may be carbon and n-type dopants. Both examples result in n-type material 834 being n-type carbon-doped silicon-germanium.

Figure 8E:
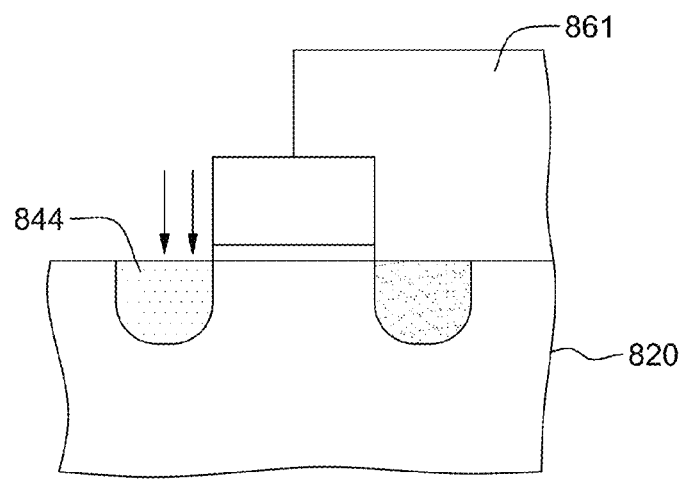
FIG. 8E depicts the structure of FIG. 8D after removing the protective mask and providing another protective mask, and implanting the drain region with a p-type implant to form a p-type material, in accordance with one or more aspects of the present invention.

FIG. 8E illustrates the structure of FIG. 8D after removing protective mask 860 (FIG. 8D), providing another protective mask 861 and implanting the drain region of substrate structure 820 with a p-type implant to form p-type material 844. The p-type implant may be, for example, acceptor atoms, such as boron, $BF_2$, etc., or may be a p-type doped material, such as, for example carbon and p-type dopants.

In one particular example, common material 850 may be carbon-doped silicon-germanium, and the p-type implant may be acceptor atoms, such as boron or aluminum. In another example, common material 850 may be silicon-germanium, and the p-type implant may be carbon and p-type dopants. Both examples result in p-type material 844 being p-type carbon-doped silicon-germanium.

Figure 8F:
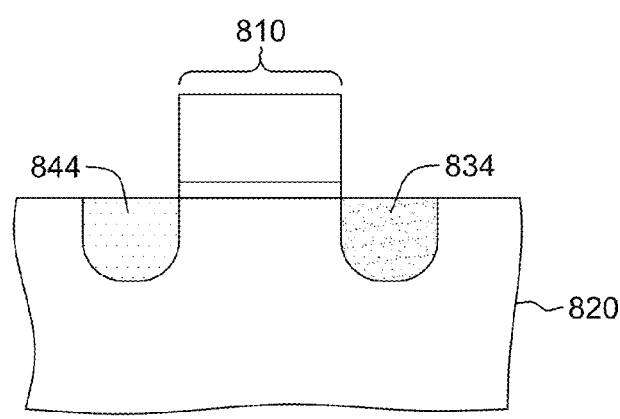
FIG. 8F depicts the structure of FIG. 8E after removing the other protective mask, in accordance with one or more aspects of the present invention.

FIG. 8F illustrates the structure of FIG. 8E after removing protective mask 861. One process example includes, after the implanting (as described with respect to FIGS. 8D-8E), annealing substrate structure 820, in order to facilitate mixing and uniformity of n-type material 834 and p-type material 844. The material properties of n-type material 834 and p-type material 844, explained with respect to FIG. 5, include a narrowed source region bandgap and a narrowed drain region bandgap. In comparison, channel region 825 has an unmodified channel region bandgap. The narrowed source region bandgap and the narrowed drain region bandgap facilitate quantum tunneling of charge carriers from the source region or the drain region to the channel region.

For example, the narrowed source region bandgap could have an adjusted (increased) source region valence band, closer to the channel region conduction band or the drain region conduction band, leading to a reduced potential gap facilitating quantum tunneling of charge carriers such as electrons. In addition, the narrowed drain region bandgap could have an adjusted (decreased) drain region conduction band, further reducing the potential gap and enhancing the quantum tunneling. Similar considerations show that an adjusted (increased) drain region valence band and adjusted (decreased) source region conduction band, would facilitate quantum tunneling of charge carriers such as holes.

The combination of these adjusted bandgaps, facilitating quantum tunneling of both holes and electrons, allow for the current-voltage curve of FIG. 7C, having both a positive slope region and a negative slope region, because both the source region and the drain region have been optimized through the modification processing discussed herein.

In one example, a source region junction may be included between the source region and the channel region, and a drain region junction may be included between the drain region and the channel region. As depicted, the gate structure may overlap either or both of the junctions. In one specific example, the gate structure may overlap either or both of the junctions by approximately 10 nanometers.

FIGS. 9A-9F illustrate other embodiments of methods for fabricating a TFET. Processing details similar to the processes described above with respect to FIGS. 8A-8F may be applicable to analogous process steps described below.

Figure 9A:
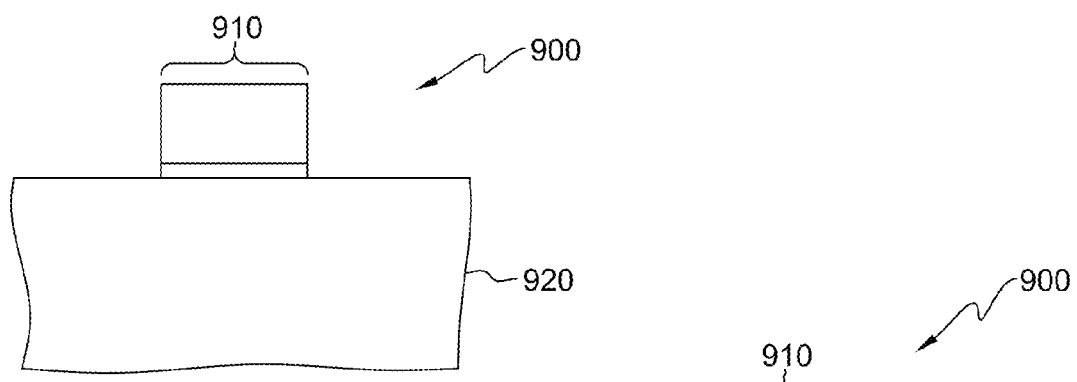
FIG. 9A is a cross-sectional elevational view of another embodiment of a structure obtained during TFET fabrication, in accordance with one or more aspects of the present invention.

FIG. 9A is a cross-sectional elevational view of one embodiment of a structure 900 obtained during TFET fabrication, in accordance with one or more aspects of the present invention. As illustrated, a gate structure 910 is disposed over a substrate structure 920. A source region and a drain region have been provided within substrate structure 920, separated by a channel region. The channel region underlies, at least partially, gate structure 910.

Figure 9B:
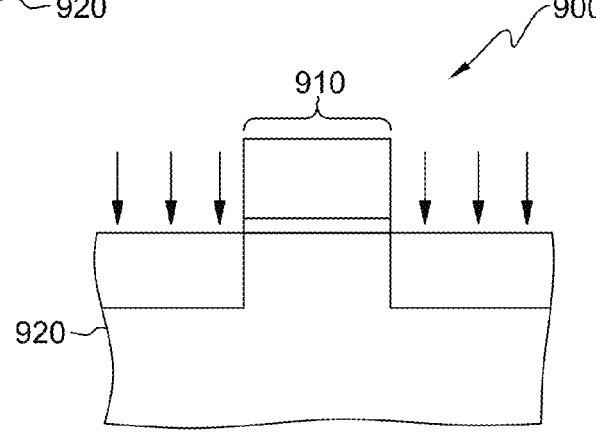
FIG. 9B depicts the structure of FIG. 9A after amorphizing a source region and a drain region of a substrate structure thereof, in accordance with one or more aspects of the present invention.

FIG. 9B depicts the structure of FIG. 9A after the source region and the drain region of substrate structure 920 have been amorphized by implantation of germanium or xenon.

Figure 9C:
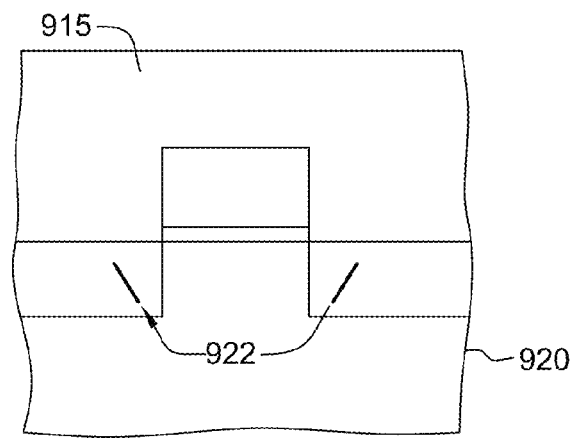
FIG. 9C depicts the structure of FIG. 9B after providing an overlying layer, and inducing memorized stresses in the source region the drain region of the substrate structure, in accordance with one or more aspects of the present invention.

FIG. 9C depicts the structure of FIG. 9B after providing an overlying layer 915, and modifying the source region and the drain region to induce memorized stresses in the source region and the drain region, thereby straining the source region and the drain region (and, potentially, the channel region). In one process example, overlying layer 915 may be, for example, a silicon nitride layer. The structure may be annealed in order to re-crystallize the source region and the drain region of substrate structure 920. For example, annealing could be annealing at a temperature of between 600° C. and 700° C. in the presence of nitrogen.

In one example, the memorized stresses could be stacking faults 922 that have been induced in substrate structure 920, due to the amorphization and re-crystallization process described herein. As known, stresses cannot be seen directly, and the location of stacking faults 922 are illustrated for ease of understanding. As described with respect to FIG. 6, the tensile strain introduced by the stacking faults (straining the source region and the drain region) may attain the narrowed source region bandgap of the source region and the narrowed drain region bandgap of the drain region.

In one example, as explained with reference to FIG. 6, the induced strain could between 1% and 2%, yielding a bandgap that is between 100 meV and 200 meV narrower than, for example, a bandgap of a silicon substrate structure 820.

Figure 9D:
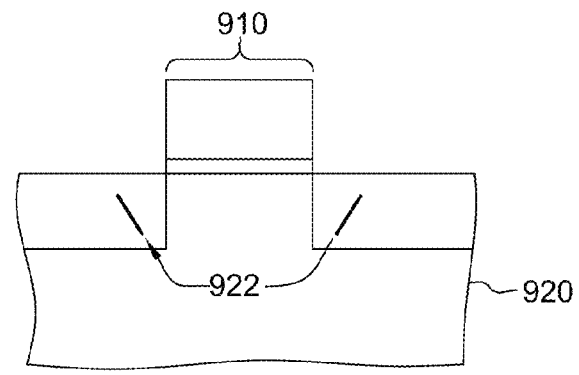
FIG. 9D depicts the structure of FIG. 9C after removing the overlying layer, in accordance with one or more aspects of the present invention.
Figure 9E:
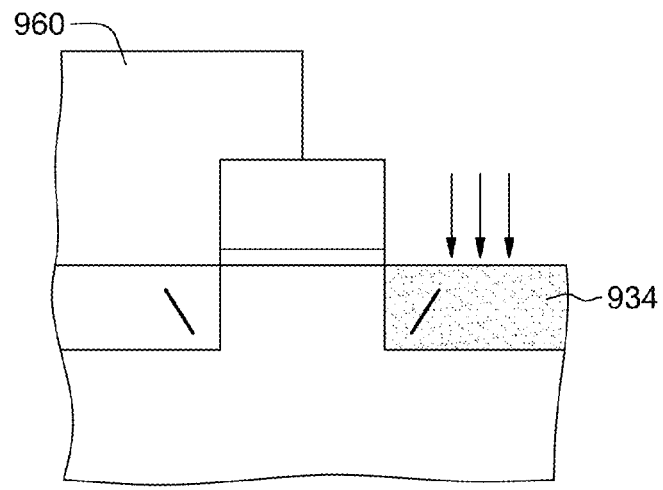
FIG. 9E depicts the structure of FIG. 9D after providing a protective mask, and implanting the source region with an n-type implant to form an n-type material, in accordance with one or more aspects of the present invention.

FIG. 9D depicts the structure of FIG. 9C after removing overlying layer 915 (FIG. 9C). Overlying layer 915 may be removed by an etchant selective to its material, for example, an etchant selective to silicon nitride. FIG. 9E illustrates the structure of FIG. 9D after providing a protective mask 960 and implanting the source region with an n-type implant to form n-type material 934.

Figure 9F:
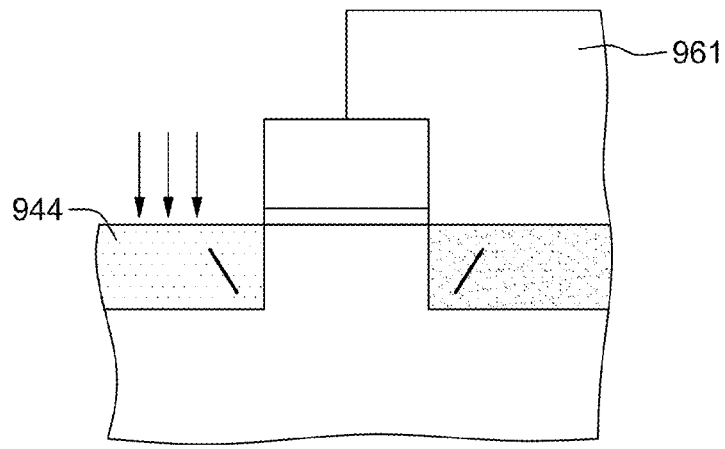
FIG. 9F depicts the structure of FIG. 9E after removing the protective mask and providing another protective mask, and implanting the drain region with a p-type implant to form a p-type material, in accordance with one or more aspects of the present invention.

FIG. 9F illustrates the structure of FIG. 9E after removing protective mask 960 (FIG. 9E), providing another protective mask 961 and implanting the drain region with a p-type implant to form p-type material 944.

Figure 9G:
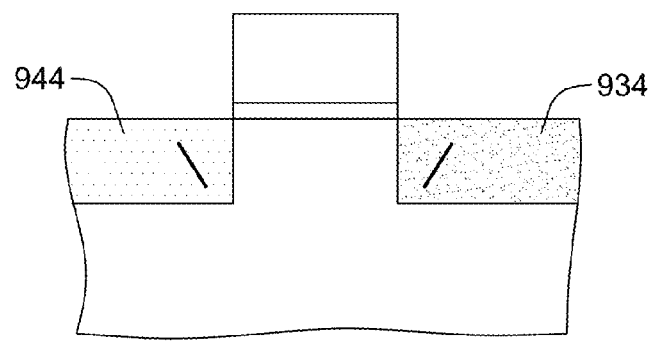
FIG. 9G depicts the structure of FIG. 9F after removing the other protective mask, in accordance with one or more aspects of the present invention.

FIG. 9G illustrates the structure of FIG. 9F after removing protective mask 961. The material properties of n-type material 934 and p-type material 944 include the narrowed source region bandgap and the narrowed drain region bandgap, and facilitate quantum tunneling of charge carriers from the source region or the drain region to the channel region.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating a tunneling field effect transistor, the fabricating comprising:
   obtaining a gate disposed over a substrate structure;
   providing a source region, the source region being one of an n-type and a p-type, and a drain region, the drain region being the other of an n-type and a p-type, within the substrate structure separated by a channel region, the channel underlying, at least partially, the gate, wherein each of the source region, drain region and channel region have a region bandgap defined by a region valence band and a region conduction band;
   overlapping the source region with the gate to form a source region junction;
   overlapping the drain region with the gate to form a drain region junction;
   modifying the source region to attain a narrowed source region bandgap that is at least 60meV narrower than the channel region bandgap; and
   modifying the drain region to attain a narrowed drain region bandgap that is at least 60meV narrower than the channel region bandgap, the narrowed source region bandgap and the narrowed drain region bandgap facilitating quantum tunneling of charge carriers between at least one of the region valence bands and at least one of the region conduction bands such that the charge carriers conduct from the source region or the drain region to the channel region;
   applying a biased gate voltage to the gate such that, within the source region junction, the region valence and conduction bands are bent to enhance quantum tunneling of one of a hole type charge carrier and an electron type charge carrier; and
   applying an oppositely biased gate voltage to the gate such that, within the drain region junction, the region valence and conduction bands are bent to enhance quantum tunneling of the other of a hole type charge carrier and an electron type charge carrier.

2. The method of claim 1, wherein the overlapping comprises overlapping with the gate by substantially 10 nanometers.

3. The method of claim 1, wherein the narrowed source region bandgap and the narrowed drain region bandgap are substantially equal bandgaps.

4. The method of claim 1, wherein modifying the source region to attain the narrowed source region bandgap comprises adjusting at least one of the source region valence band or the source region conduction band, and modifying the drain region to attain the narrowed drain region bandgap comprises adjusting at least one of the drain region valence band or the drain region conduction band.

5. The method of claim 4, wherein modifying the source region to attain the narrowed source region bandgap comprises adjusting both the source region valence band and the source region conduction band.

6. The method of claim 5, wherein modifying the drain region to attain the narrowed drain region bandgap comprises adjusting both the drain region valence band and the drain region conduction band.

7. The method of claim 1, wherein the source region of the substrate structure comprises a first region of carbon-doped silicon-germanium material, and the drain region of the substrate structure comprises a second region of carbon-doped silicon-germanium material, the carbon-doped silicon-germanium material providing the narrowed source region bandgap in the first region and the narrowed drain region bandgap in the second region.

8. The method of claim 1, wherein modifying the source region to attain the narrowed source region bandgap comprises inducing a memorized stress in the source region of the substrate structure, and modifying the drain region to attain the narrowed drain region bandgap comprises inducing another memorized stress in the drain region of the substrate structure.

9. The method of claim 8, wherein the memorized stress comprises a stacking fault in the source region of the substrate structure and the another memorized stress comprises another stacking fault in the drain region of the substrate structure.

10. The method of claim 1, wherein modifying the source region and modifying the drain region comprise:
    removing portions of the source region and the drain region to form a source cavity in the source region of the substrate structure and a drain cavity in the drain region of the substrate structure; and
    providing a common material within the source cavity of the source region and the drain cavity of the drain region, wherein the common material has a common bandgap, the narrowed source region bandgap and the narrowed drain region bandgap equaling the common bandgap.

11. The method of claim 10, wherein the common material comprises a carbon-doped silicon-germanium material.

12. The method of claim 10, wherein modifying the source region and modifying the drain region of the substrate structure further comprise, after providing the common material within the source cavity and the drain cavity, implanting one of the source region or the drain region with an n-type implant to form n-type material and the other of the source region or the drain region with a p-type implant to form p-type material.

13. The method of claim 12, wherein modifying the source region and modifying the drain region further comprise, after implanting, annealing the substrate structure, wherein the annealing facilitates attaining the narrowed source region bandgap and attaining the narrowed drain region bandgap.

14. The method of claim 12, wherein the common material comprises silicon-germanium, the n-type implant comprises carbon and n-type dopants, and the p-type implant comprises carbon and p-type dopants.

* * * * *